United States Patent [19]

Watanabe et al.

[11] Patent Number: 4,691,188

[45] Date of Patent: Sep. 1, 1987

[54] CIRCUIT BOARD

[75] Inventors: Masamichi Watanabe; Yasushi Watanabe, both of Miyagi, Japan

[73] Assignee: Alps Electric Co., Ltd., Japan

[21] Appl. No.: 838,286

[22] Filed: Mar. 10, 1986

[30] Foreign Application Priority Data

Mar. 8, 1985 [JP] Japan ............... 60-33009[U]

[51] Int. Cl.⁴ ............................. H01C 1/012
[52] U.S. Cl. ................... 338/307; 174/88 R; 338/314
[58] Field of Search ............... 338/307–309, 338/162, 203, 212, 314–316, 319, 320, 322, 195, 334; 174/88 R, 117 A, 117 FF; 219/216

[56] References Cited

U.S. PATENT DOCUMENTS

| 4,113,981 | 9/1978 | Fujita et al. | 174/88 R |
| 4,405,929 | 9/1983 | Sugano | 219/216 PH |
| 4,433,887 | 2/1984 | Sado et al. | 174/88 R X |
| 4,588,456 | 5/1986 | Dery et al. | 174/117 FF X |

Primary Examiner—C. L. Albritton
Attorney, Agent, or Firm—Guy W. Shoup

[57] ABSTRACT

A circuit board that can be manufactured economically and reliably comprises first and second insulating films and an electrically conductive heat-seal film. Circuit patterns of first and second electrical parts are formed on the first and second insulating films, respectively. These circuit patterns are selectively connected with each other through the heat-seal film. The first insulating film has a hole in which the second insulating film is retained in such a way that the patterns on the first and second insulating films are substantially coplanar with each other.

3 Claims, 3 Drawing Figures

CIRCUIT BOARD

FIELD OF THE INVENTION

The present invention relates to a circuit board having patterns of a switch, a rheostat, etc.

BACKGROUND OF THE INVENTION

Circuit boards now available and having switches, rheostats, and other electrical parts come in two kinds. As one kind, flexible circuit boards made of polyethylene film or the like and on which patterns of electrical parts such as switches or other circuit patterns have been previously formed, the boards being bonded to retaining plates. Previously fabricated rheostats have protrusions extending from the bottom, the protrusions being fitted in holes that extend through both the flexible circuit board and the retaining plate. Thus, the rheostats are firmly fixed to the flexible circuit and the retaining plate. Resistance patterns and charge-collective patterns are formed on the circuit board. Connection terminals are connected to the resistance patterns and the charge-collecting patterns, and are formed in proximity to the rheostats on the flexible circuit board. The connection terminals and the connection patterns are electrically connected with the edge connector of the circuit board using known electrically conductive heat-seal film. Circuit boards of another kind consists of heat-resistant film made from polyimide or other similar material. Resistors of switches and rheostats, charge collectors, patterns of electrical parts, and other circuit patterns are all formed on the circuit board, which is bonded to a retaining plate. Slider supports to which the sliding contacts of rheostats are rigidly fixed have retaining portions engaged in holes that extend through the circuit board and the retaining plate.

In the first-mentioned conventional circuit board, the connection terminals of the rheostats are not coplanar with the connection patterns of the flexible circuit board. Further, the casings of the rheostats have protrusions. Therefore, when the conductive heat-seal film is heated, it cannot be stably bonded. This can result in poor connection. In the last-mentioned conventional circuit board, switches, rheostats, and other patterns are formed on the same film, so that patterns are reliably connected with each other. However, those patterns are formed in overlapped relation by ordinary printing techniques at several manufacturing steps. Although the area of the resistance patterns accounts for only a small proportion of the area of the circuit board, the number of manufacturing steps per unit time is very small, because the large area of the circuit board must be fabricated during one manufacturing process. Hence, the manufacturing cost cannot be reduced.

SUMMARY OF THE INVENTION

In view of the foregoing difficulties with the prior art techniques, it is the object of the present invention to provide a circuit board on which patterns are reliably connected with each other, and which is inexpensive to manufacture.

The above object is achieved by a circuit board comprising: a first insulating film on which a circuit pattern of a first electrical part is formed; a second insulating film on which a circuit pattern of a second electrical part is formed; an electrically conductive heat-seal film through which the two circuit patterns can be connected with each other; and a hole formed in the first insulating film, the second insulating film being retained in the hole such that the patterns on the first and second insulating films are substantially coplanar with each other.

DETAILED DESCRIPTION OF THE INVENTION

Figure 1:
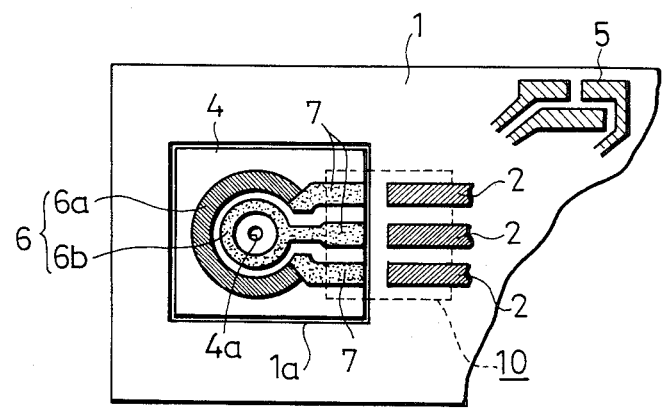
FIG. 1 is a plan view of a circuit board according to the invention.
Figure 2:
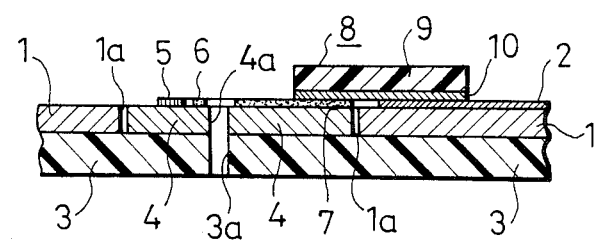
FIG. 2 is a vertical cross section of the circuit board shown in FIG. 1.
Figure 3:
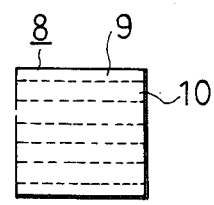
FIG. 3 is a plan view of the electrically conductive heat-seal film shown in FIGS. 1 and 2.

Referring to FIGS. 1-3, there is shown a circuit board according to the present invention. This board has a flexible, first insulating film 1 made from polyethylene or other similar material. A switch 5 that is a first electrical part and other wiring patterns are printed on the film 1 with conductive ink, for example. The film 1 is provided with a hole 1a at a given position. A plurality of connecting patterns 2 which are brought out from the switch 5 and the other wiring patterns are formed near one end of the hole 1a. The connecting patterns 2 are printed simulataneously with the switch 5 and the other wiring patterns. The insulating film 1 formed as described above is bonded to a retaining plate 3 via bonding members at given positions. The plate 3 is made of either a laminate consisting of a synthetic resin or a metal plate. A flexible, insulating film 4 has a thickness substantially equal to that of the film 1, and is made from polyethylene, polyimide, or other similar material. The film 4 is placed in the hole 1a within the film 1. A resistance pattern 6a and a charge-collecting pattern 6b of a rheostat 6 that is a second electrical part are formed on the film 4 as by printing. The resistance pattern 6a can be formed by several printing steps to obtain desired characteristics. A plurality of connector terminals 7 which are brought out from the resistance pattern 6a and the charge-collecting pattern 6b are formed near one end of the second insulating film 4. During the above-described printing process, a number of patterns are printed simultaneously on a film having a size large enough to permit a number of insulating films 4 to be placed on it in side-by-side relation. After completing the printing process, the film is cut into insulating films 4.

The arc-shaped resistance pattern 6a is centrally provided with a round hole 4a. The second insulating film 4 formed in this way is brought into registry with the upper surface of the retaining plate 3 which is exposed through the hole 1a in the first insulating film 1. Then, the film 4 is bonded to the film 1 via bonding members so that the pattern on the first insulating film 1 is made substantially coplanar with the pattern on the second insulating film 4. The retaining plate 3 has been previously formed with a round hole 3a so that a slider support is pivotally mounted in the hole 3a. This hole 3a is smaller than the hole 4a and is so disposed that it opens into the hole 4a in the second film 4. An electrically conductive heat-seal film 8 consists of a flexible film 9 together with an electrically conductive heat seal 10 that is formed into a desired shape on the underside of the film 9. The heat-seal film 8 is joined by placing the heat seal 10 formed on the underside of the film 8 in opposition to the connecting patterns 2 on the first insulating film 1 and to the connecting terminals 7 on the second insulating film 4, and then by applying heat and pressure to the joint from above the film 8.

A slider support equipped with the slider of a rheostat is mounted in a casing that has an opening on its lower side. Retaining claws extend downward from the periphery of the opening. Mechanisms such as the slider support and the casing are rigidly attached to the circuit board by engaging the claws into holes extending through both the second insulating film 4 and the retaining plate 3.

As described thus far, the novel circuit board according to the invention comprises: a first insulating film on which a circuit pattern of a first electrical part is formed; a second insulating film on which a circuit pattern of a second electrical part is formed; and an electrically conductive heat-seal film through which the circuit patterns on the first and second insulating films are selectively connected with each other. The first insulating film is provided with a hole in which the second insulating film is retained in such a way that the pattern on the first insulating film is substantially coplanar with the pattern on the second insulating film. Therefore, when heat and pressure are applied, the heat seal film can be stably bonded. Hence, connections can be made reliably. Further, since a number of second insulating films involving many manufacturing steps and including patterns of, for example, rheostats can be simultaneously processed, the circuit board can be manufactured inexpensively.

What is claimed is:

1. A circuit board comprising:
   a first insulating film having a hole defined therethrough and a first circuit pattern formed on one surface thereof including a plurality of first connecting terminals formed adjacent to one edge of said defined hole;
   a second insulating film having a second circuit pattern formed on one surface thereof including a plurality of second connecting terminals formed adjacent to one edge of said second insulating film, said second insulating film being retained in said hole of said first insulating film such that said one edges of the respective films are adjacent each other and said first and second connecting terminals are substantially coplanar with each other; and
   a heat-seal film having an electrically conductive portion on one side thereof which is placed over said first and second connecting terminals for selectively connecting said terminals of said first and second circuit patterns electrically with each other.

2. A circuit board as set forth in claim 1, wherein the first and second insulating films are held to the same retaining plate.

3. A circuit as claimed in claim 1, wherein a circuit element is mounted in operative electrical contact on said second circuit pattern of said second insulating film.

* * * * *